(12) United States Patent
Aigner et al.

(10) Patent No.: US 8,198,958 B1
(45) Date of Patent: Jun. 12, 2012

(54) POWER AMPLIFIER MATCHING RF SYSTEM AND METHOD USING BULK ACOUSTICS WAVE DEVICE

(75) Inventors: Robert Aigner, Ocoee, FL (US); Gernot G. Fattinger, Ocoee, FL (US); Mikhail S. Shirokov, Methuen, MA (US); Jun C. Jadormio, Lowell, MA (US)

(73) Assignee: Triquint Semiconductor, Inc., Hillsboro, OR (US)

( * ) Notice: Subject to any disclaimer, the term of this patent is extended or adjusted under 35 U.S.C. 154(b) by 435 days.

(21) Appl. No.: 12/413,681

(22) Filed: Mar. 30, 2009

(51) Int. Cl.
*H03H 9/205* (2006.01)
*H03H 9/54* (2006.01)
*H03H 9/60* (2006.01)

(52) U.S. Cl. ......... 333/189; 333/191; 310/322; 310/364

(58) Field of Classification Search .................. 333/189, 333/191; 310/322–324, 334, 335, 363, 364
See application file for complete search history.

(56) References Cited

U.S. PATENT DOCUMENTS

| | | | |
|---|---|---|---|
| 6,670,866 B2 * | 12/2003 | Ella et al. .................. | 333/133 |
| 6,741,145 B2 * | 5/2004 | Tikka et al. ................ | 333/133 |
| 6,879,224 B2 * | 4/2005 | Frank ......................... | 333/189 |
| 7,102,460 B2 * | 9/2006 | Schmidhammer et al. ... | 333/133 |
| 7,391,286 B2 * | 6/2008 | Jamneala et al. ............ | 333/189 |
| 7,424,772 B2 * | 9/2008 | Larson, III .................. | 29/25.35 |
| 7,586,391 B2 * | 9/2009 | Volatier et al. .............. | 333/188 |
| 7,598,827 B2 * | 10/2009 | Stuebing et al. ............. | 333/189 |
| 7,612,636 B2 * | 11/2009 | Jamneala et al. ............ | 333/189 |
| 7,786,826 B2 * | 8/2010 | Thalhammer et al. ....... | 333/189 |
| 7,855,618 B2 * | 12/2010 | Frank et al. ................. | 333/187 |
| 2004/0201305 A1 * | 10/2004 | Aigner et al. ............... | 310/311 |
| 2005/0093652 A1 * | 5/2005 | Ma et al. ..................... | 333/187 |
| 2005/0104689 A1 * | 5/2005 | Inoue ........................... | 333/189 |
| 2005/0128030 A1 * | 6/2005 | Larson et al. ............... | 333/191 |
| 2007/0210879 A1 * | 9/2007 | Cardona et al. ............ | 333/188 |
| 2008/0169884 A1 * | 7/2008 | Matsumoto et al. ........ | 333/187 |
| 2008/0246556 A1 * | 10/2008 | Heinze et al. ............... | 333/133 |
| 2008/0297278 A1 * | 12/2008 | Handtmann et al. ........ | 333/189 |
| 2008/0297280 A1 * | 12/2008 | Thalhammer et al. ....... | 333/189 |
| 2009/0096550 A1 * | 4/2009 | Handtmann et al. ........ | 333/189 |

* cited by examiner

*Primary Examiner* — Barbara Summons
(74) *Attorney, Agent, or Firm* — Schwabe Williamson & Wyatt

(57) ABSTRACT

An RF system includes a power amplifier with output impedance and a BAW filter with an input impedance and output impedance. A matching network includes an inductance connecting the power amplifier to the BAW filter and an impedance transformation ratio of at least 1:10 is provided at the output impedance of the power amplifier to the output impedance of the BAW filter.

4 Claims, 6 Drawing Sheets

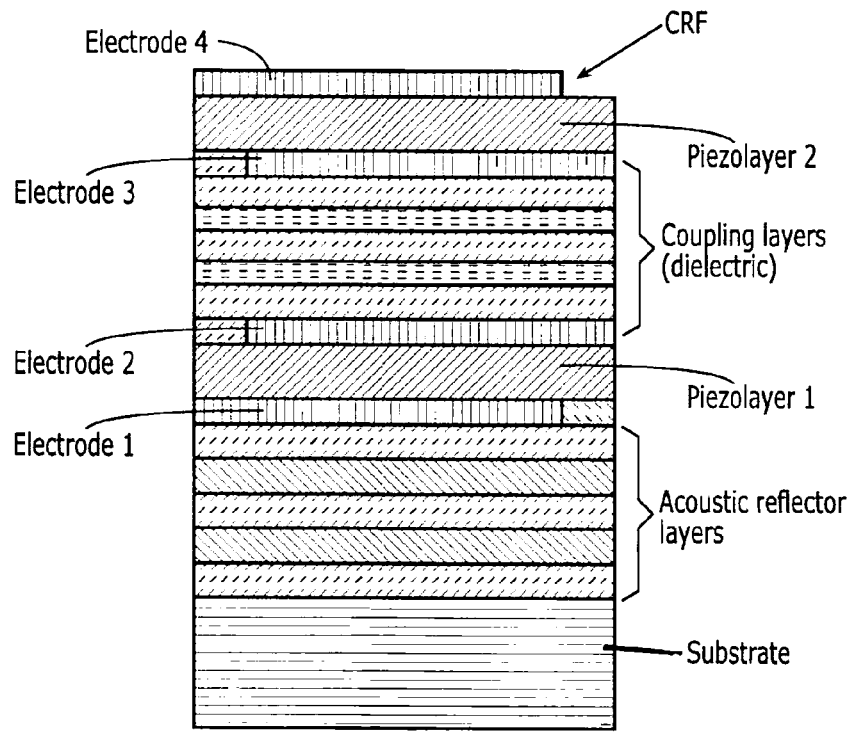

Figure 5b
(PRIOR ART)

| Layer | | Function | # | Material | Thickness[nmm] |
|---|---|---|---|---|---|
| Top-Electrode | a | Top-Electrode (24) | a | AlCu | 115 |
| Top-Electrode | b | of Top-Resonator | b | W | 139 |
| Piezo | (28) | Top-Resonator | 36 | AlN | 955 |
| Center-Electrode | a | Coupling layers and | a | W | 122 |
| Center-Electrode | b | Electrode (32) | b | AlCu | 495 |
| Center-Electrode | c | Bottom | c | W | 196 |
| Piezo | (30) | -Resonator | 38 | AlN | 829 |
| Bottom-Electrode | a | Bottom Electrode | a | W | 103 |
| Bottom-Electrode | b | of Bottom Resonator | b | AlCu | 115 |
| Reflector | a | Reflector layers (42) | a | SiO2 | 720 |
| Reflector | b | | b | W | 470 |
| Reflector | c | | c | SiO2 | 440 |
| Reflector | d | | d | W | 670 |
| Reflector | e | | e | SiO2 | 560 |
| Substrate | | Carrier | 40 | Si | any |

Figure 6

POWER AMPLIFIER MATCHING RF SYSTEM AND METHOD USING BULK ACOUSTICS WAVE DEVICE

FIELD OF INVENTION

The present invention generally relates to radio frequency power amplifiers, and more particularly to matching the power amplifier output with a combination of acoustic wave and passive devices and integrated passive devices and related methods.

BACKGROUND OF THE INVENTION

Radio frequency (RF) power amplifiers (PA) typically constitute a core of RF systems such as front-end modules (FEM) that provide up-converted signal transmission over the air in wireless telecommunications by amplifying a signal supplied by a radio and fed to an antenna. Typically, the antenna has a 50 Ohm impedance at the transmit frequency. Within the FEM, the power amplifier is required to be matched to the antenna impedance, (e.g. 50 Ohm). In order to deliver a required RF power to the antenna, the PA has to be presented with correct load impedance. The transformation of the antenna impedance to the necessary PA load impedance is typically done using passive components, such as capacitors and inductors, monolithically integrated or in discrete form as will be addressed later in this specification. The output impedance transformation network, in addition to the impedance matching, is also required to perform a filtering function to reduce out-of-band spurious signals, whose levels are guided by Federal Communications Commission (FCC) regulations. Typically, a filter is incorporated to enhance spurious signal suppression. The total loss of the network is the combination of the losses experienced by the PA and the filter plus the loss due to the impedance transformation network. Total post PA loss inside the FEM adversely affects the DC power consumption, and thus the Power Added Efficiency (PAE).

There is a need for an FEM that lowers the overall post PA output loss by 1 dB-1.5 dB, improves DC power consumption by 20-40%, provides robust (temperature and process stable) out-of-band signal filtering, achieves lower system operating temperature, and achieves a smaller overall FEM size.

SUMMARY OF THE INVENTION

In view of the foregoing background, the teachings of the present invention provide devices and methods of matching the PA at the output and provide a blend of Bulk Acoustics Wave (BAW) devices and integrated passive devices in a GaAs monolithic microwave integrated circuit (MMIC), by way of example, to simultaneously achieve several desirable FEM characteristics.

One FEM embodiment may comprise a power amplifier with output impedance, a BAW filter with input impedance and output impedance, and a matching network comprising at least an inductance operable between the output port of the power amplifier and the BAW filter. The impedance transformation ratio at the output impedance of the amplifier to that of the BAW filter may preferably be at least 1:10.

The BAW filter may comprise a two resonator structure having a top electrode, a first piezoelectric layer, a center electrode, a second piezoelectric layer and a bottom electrode, wherein the center electrode is made of a metal stack of at least three layers of metal to provide a mechanism for controlling the acoustic coupling between the two resonators.

BRIEF DESCRIPTION OF THE DRAWINGS

Embodiments of the invention are described, by way of example, with reference to the accompanying drawings in which:

FIGS. 5a and 5b are diagrammatical illustrations of filter structures in cross section for well known Stacked Crystal Filter (SCF) and Coupled Resonator Filter (CRF);

FIG. 6 is a Table illustrating element features, by way of example, for a 2.5 GHz, inductance L1=0.94 pH, L2=1.15 pH for the structure of FIG. 3 used in a configuration as illustrated in FIGS. 2a and 2b;

DETAILED DESCRIPTION OF THE PREFERRED EMBODIMENTS

The present invention will now be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
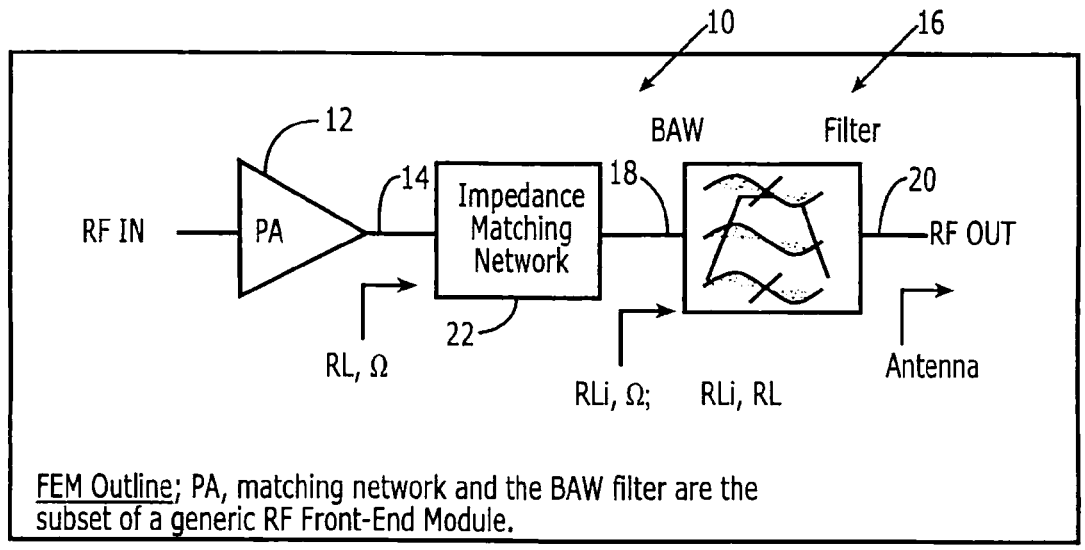
FIG. 1 is a diagrammatical schematic illustrating one embodiment of a Power Amplifier matched with a BAW filter and L-C components in keeping with the teachings of the present invention.
Figure 2A:
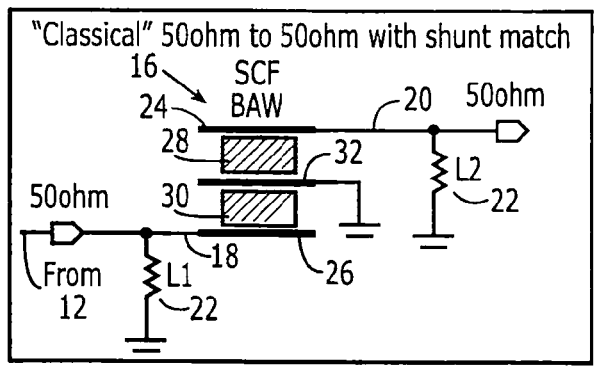
FIGS. 2a and 2b are diagrammatical illustrations of a Bulk Acoustic Wave (BAW) Resonator used as a filter and impedance transformer.
Figure 2B:
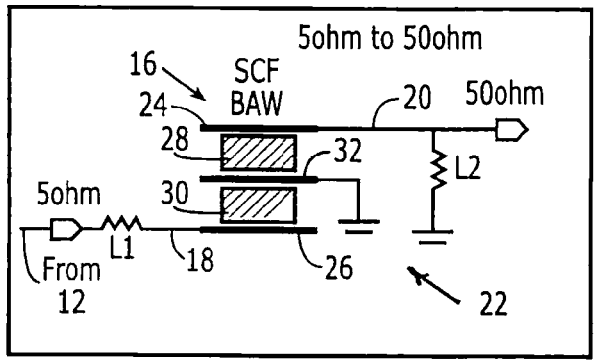

Referring initially to FIGS. 1, 2a and 2b, one embodiment of the invention is herein described as an RF system 10 comprising a power amplifier 12 having an output 14 and output impedance, and a BAW filter 16 having an input 18, and an output 20 and output impedance. A matching network 22 operable with the BAW filter 16 has an inductance measurable between the power amplifier 12 and the BAW filter 16, wherein an impedance transformation ratio at the output impedance of the power amplifier to the output impedance of the BAW filter is at least 1:10.

Figure 3:
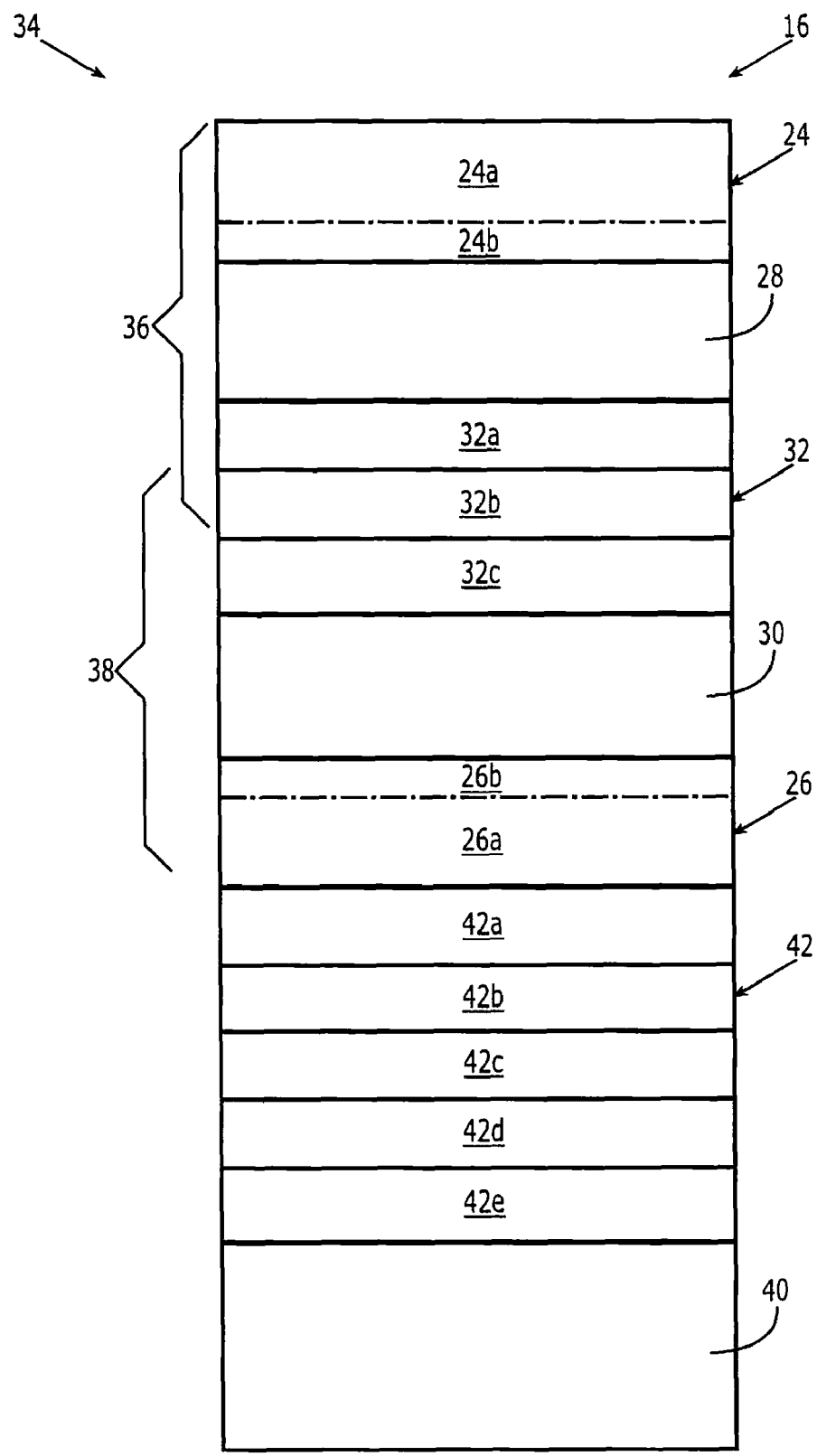
FIG. 3 is a diagrammatical cross section illustration of one embodiment of an acoustic wave filter device having a wide bandwidth and high impedance transformation ratio.

One embodiment of the BAW filter 16 is herein described by way of example with continued reference to FIGS. 2a and 2b, and with reference now to FIG. 3 as including a top electrode 24 and a bottom electrode 26 with first and second piezoelectric layers 28, 30 sandwiched between the top and bottom electrodes. A center electrode 32 is sandwiched between the first and second piezoelectric layers 28, 30 so as to form a two resonator structure 34 having first and second resonators 36, 38 sharing the center electrode 32. The center electrode 32 is made of a metal stack of at least three layers 32a, 32b, 32c of metal.

By way of example, the three layers of metal may comprise a copper doped aluminum metal 32b sandwiched between two tungsten layers 32a, 32c, wherein the central metal layer has a lower acoustic impedance than the metal between which it is sandwiched. Another example of an embodiment in keeping with the teachings of the present invention comprises the center electrode 32 having three layers in which the central layer 32b includes a low impedance material such as silicon oxide. Thus, the layers comprising the center electrode 32 may include the silicon oxide layer 32b sandwiched between two tungsten layers 32a, 32c. As illustrated with reference to FIGS. 2a and 2b, the center electrode 32 for such an arrangement including the silicon oxide layer 32b would have the electrically conductive portions 32a, 32c electrically connected, such as to ground, herein illustrated by way of example.

Yet further, and with continued reference to FIG. 3, at least one of the top and bottom electrodes 24, 26 may alternatively comprise of a stack of two metals 24a, 24b and/or 26a, 26b.

By way of further example for one embodiment of the BAW filter 16, and with continued reference to FIG. 3, the BAW filter may further comprise a substrate 40 and an acoustically reflective layer 42 carried by the substrate, wherein the bottom electrode 26 is carried by the reflective layer. The reflective layer 42, herein described by way of example, comprises a plurality of reflective layers 42a, 42b, 42c, 42d, and 42e, with one embodiment including alternating layers of silicon oxide 42a, 42c, 42e and tungsten 42b, 42d.

Figure 4:
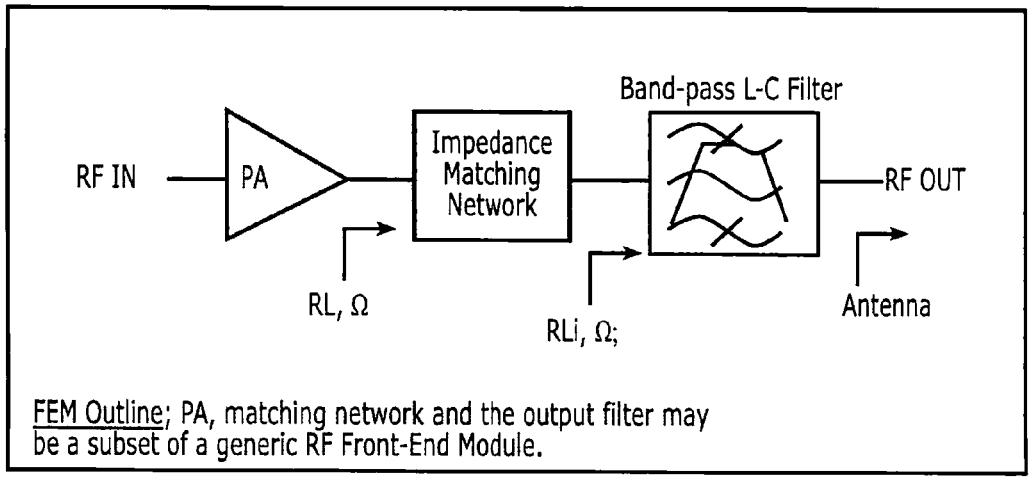
FIG. 4 is a diagrammatical schematic illustration of a known power amplifier matched with L-C components.

To better appreciate the problems solved by the present invention, reference is now made to FIG. 4, by way of example for known embodiments and methods. A typical way of output PA matching is to provide an impedance transformation network based on inductors and capacitors that will rotate the antenna impedance to the PA load impedance. Here, the output impedance of the PA is of the order of several ohms and that of the antenna impedance is usually 50 ohms. Thus impedance transformation of at least 1:10 ratio is required for the PA matching network. Since such a matching network can perform only limited filtering, an additional filter is inserted after the matched PA. The filter may be implemented using passive inductors and capacitors. FIG. 4 demonstrates one such standard approach, wherein a PA is followed by an impedance transforming matching network succeeded by an output spurious signal filter. It should be noted, that other components, such as multiplexers and RF power switches may be present at the PA output inside or outside the FEM, but are omitted here since they bare no material impact on the solution presented by the embodiments of the present invention.

With continued reference to FIG. 4, the output matching network typically introduces between 1 dB and 1.5 dB of loss in broad-band PA's. The post PA filter, when demanded in a band-pass configuration, adds another ~1.5 dB of loss. While SAW and BAW filters are well known in the art, they are typically used in systems in which the impedance transformation is well below the ratio of 1:10. Although the filter and the matching network can be combined to produce a multi-stage impedance transformation, impact on the total loss is typically minimal, except for the reduced size of such implementation.

To estimate available power required at the PA output in order to overcome the losses, the total post PA loss has to be added to the specified power out of the FEM. For example, with the post PA loss of 3 dB, to deliver 24 dBm of RF power out of the FEM, the available power from the PA needs to be 27 dBm. As is appreciated by those skilled in the art, the post PA loss not only places a demand for higher output RF power from the PA, but also increases the required dissipated DC power needed to generate the RF power.

Figure 5A:
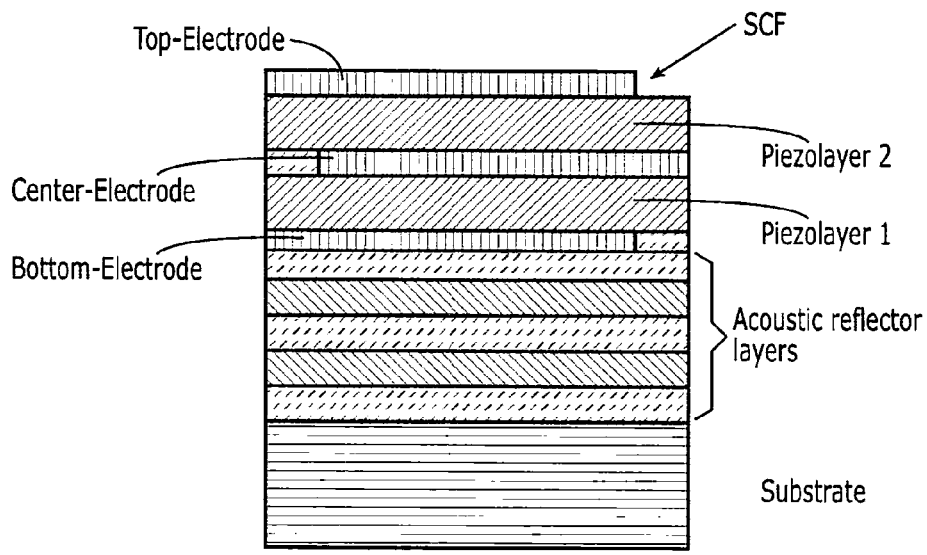

As in known in the art, Bulk Acoustic Wave (BAW) filters may include two types of resonator structures. The first resonator structure type comprises a thin layer of piezoelectric layer placed between the two metal electrodes and generally a cavity is formed beneath the thin film resonator. This resonator structure is called thin film bulk acoustic wave resonator or FBAR. The second resonator structure comprises a thin piezoelectric layer sandwiched between two metal electrodes and is mounted on top of several reflective layers. This resonator structure is called a Solidly Mounted Resonator or SBAR. Known bulk acoustic filters typically include configurations with more than one piezoelectric layer that are referred to as Stacked-Crystal-Filters (SCF) and Coupled-Resonator-Filters (CRF). A conventional SCF structure is illustrated with reference to FIG. 5a. Conventional wisdom teaches that the center electrode should pass the acoustic wave between lower and upper piezoelectric layer with little reflection and essentially no frequency selectivity, hence resulting in a very strong acoustic interaction between the vibrations energy in the lower and upper resonators exists. The thicknesses of the layers are typically designed such that both resonators operate close to a standing half-wave condition in the passband. Such a configuration yields the highest electro-acoustic coupling within and between the piezoelectric layers and produces favorable passband characteristics. Unfortunately the bandwidth a SCF of this type can achieve is restricted by the effectiveness of the piezoelectric material in converting between acoustical and electrical energy. Typical thin-film piezoelectric materials like Aluminum Nitride will allow making filters with a relative bandwidth of no more than 2%. Thus, while the standard SCF allows an impedance transformation of at least 1:10, it is limited to a narrow fractional bandwidth application.

The more complex type of a BAW device that allows for wider fractional bandwidth is known as the CRF, and is illustrated with reference to FIG. 5b, by way of example. Two resonators in which each has its own pair of electrodes are acoustically coupled through a stack of coupling layers. The coupling layers are chosen such that acoustic waves are transmitted only at certain frequencies. CRFs typically need a stack of several dielectric layers between the two resonators to achieve a desired transfer function. The main motivation to introduce CRFs is the freedom to refer signals to ground or feed them as differential signals to either port of the filter. In order to accomplish this goal, the coupling layers must include dielectric materials. If the degree of acoustic interaction between the two resonators is weak but strongly frequency dependent a narrow filter passband can be achieved. Using Aluminum Nitride as a piezoelectric material allows a CRF to achieve a relative bandwidth of 4%. Stronger acoustic interaction leads to difficulties in impedance matching of CRFs and to undesired characteristics. Shunt inductors are known to improve the impedance matching problem of CRFs and enable to widen the relative bandwidth of the filter. It is known in the industry to accomplish an impedance transformation by a ratio of 1:4 using a CRF pair with input resonators in parallel configuration and output resonators in series configuration. Higher impedance transformation ratios have not been reported.

With an understanding of known devices, attention is again given to embodiments of the present invention. By way of example, a front end module is illustrated by matching an output of the PA using a combination of a BAW filter structure and passive (L, C) elements, including impedance transformation and filtering. Out of band rejection of spurious signals closely adjacent to the frequency pass band calls for a high-order high rejection filter to be used at the PA output. One requirement includes low noise level at the out of band frequencies. At the same time, noise levels as low as possible in band loss are desired. The filter at the PA output reduces the noise generated by the PA and coupled from the power supplies to the RF output. BAW filters, by nature of their high-Q resonance, have been determined to be excellent for the job.

As earlier described, by way of example, the BAW filter 16 according to the teachings of the present invention provides a simplified CRF structure in which no dielectric coupling layers are required. As above described, the center electrode 32 may be a stack of three metal layers 32a, 32b, 32c as illustrated with reference to FIG. 3 and Table of FIG. 6. In one embodiment of the invention, the center electrode 32 may comprise tungsten (W) 32a, copper doped aluminum (AlCu) 32b and tungsten 32c as the three metal layers. The top electrode 24 and the bottom electrode 26 may comprise of a stack of at least two different metals. As illustrated by way of example, the two metal stacks forming the top and bottom electrodes 24, 26 may be copper doped aluminum and tungsten. The center electrode 32 is constructed such that frequency selective acoustic interaction between the lower, second resonator 38 and the upper, first resonator 36 is achieved. This is accomplished by selecting the thickness and acoustic properties of each of the three layers of the center electrode 32. For the example illustrated in the Table of FIG. 6, W represents a high acoustic impedance layer while Al copper doped metal has low acoustic impedance. Thus, the center electrode 32 comprises at least three layers in which the layer 32b of low acoustic impedance is sandwiched between two higher acoustic impedance layers 32a, 32c. Another embodiment of the center electrode 32 may comprise three layers in which the central layer 32b comprises a silicon oxide sandwiched between two layers 32a, 32c of tungsten. The multi metal layers 32a, 32b, 32c of the center electrode 32 allow for an acoustic interaction that is much stronger than in a typical CRF but much weaker than in a typical SCF. It is of interest to note that no dielectric coupling layers are used for single-ended operation of the filter thus simplifying the manufacturing process significantly.

Figure 7A:
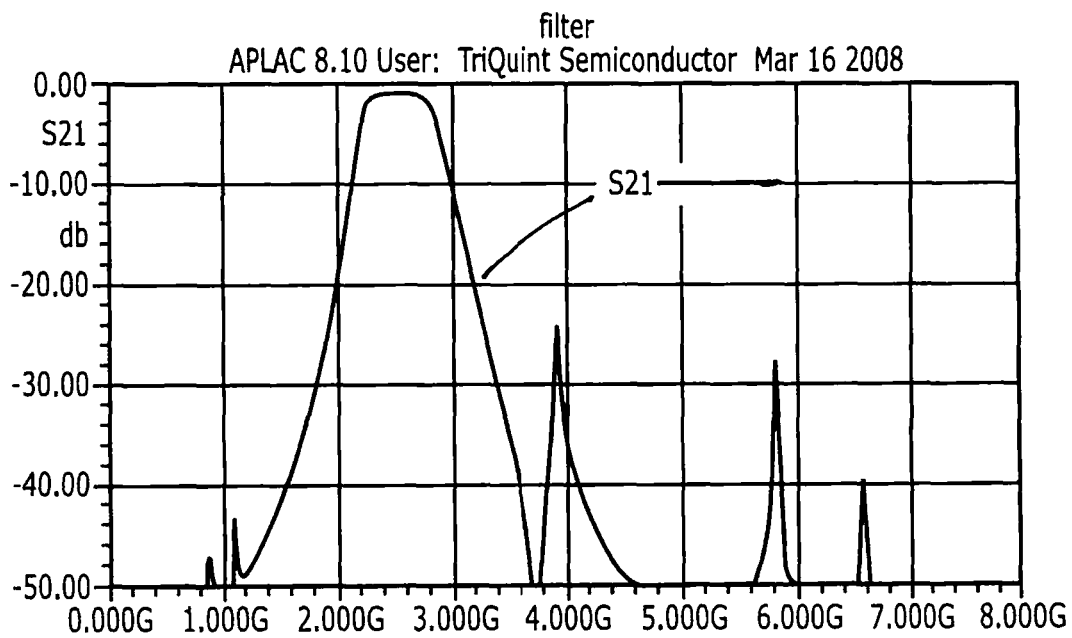
FIGS. 7a and 7b illustrate a complete BAW filter response and pass band only response, respectively.
Figure 7B:
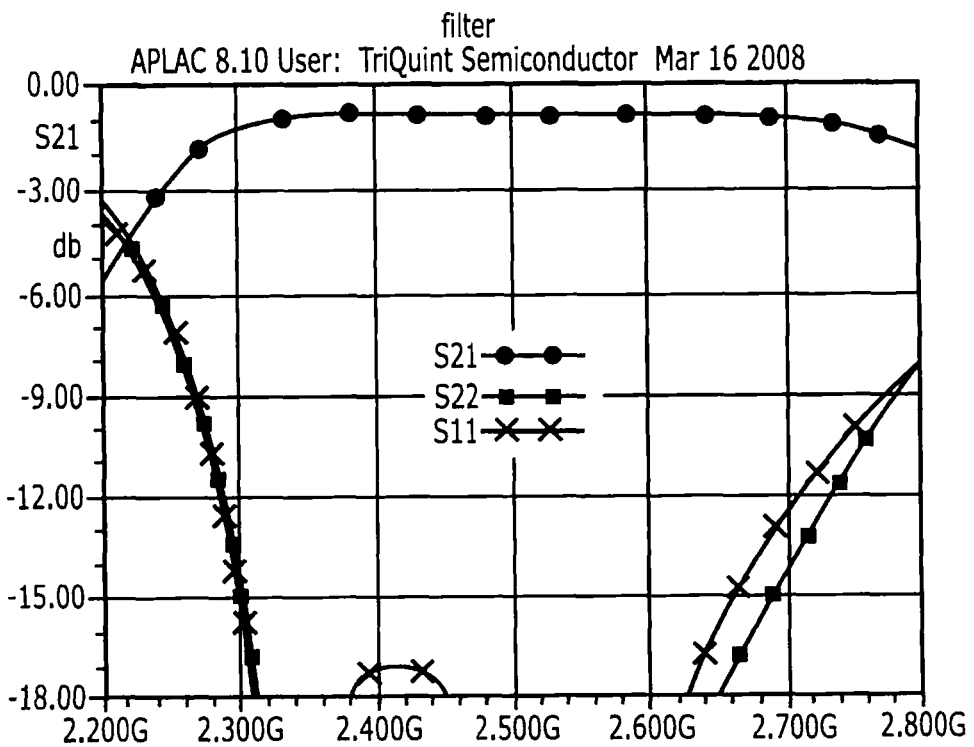

With reference again to FIG. 2b, an embodiment of the invention may include the BAW filter 16 that, when combined with the passive components 22, produces a band pass filter having a filter response as illustrated with reference to FIG. 7a and with desirable steep out of band roll off characteristics, as depicted in FIG. 7b. This filter may be configured to provide no impedance transformation as shown in FIG. 2a. The filter can also be configured for a large impedance transformation of 1:10 or larger, for example, the 5 ohms to 50 ohms rotation as illustrated with reference again to FIG. 2b. In both cases, the in band filters insertion loss stays within 1 dB. In order to match this structure to 50 Ohms, shunt inductors L1 and L2 are used as herein illustrated by way of example.

The teachings of the present invention reveal that in a shunt matched configuration operating near resonance, the feed-point for the load and source can be moved to different positions if source/load impedance is adjusted appropriately. In the case described with reference to FIG. 2b, the feed-point from FIG. 2a has been moved to the opposite side of inductor L1 and as a consequence, the resonance circuit requires a change from 50 ohm impedance to about the 5 Ohm impedance.

As illustrated with reference again to FIG. 1, an embodiment of the invention providing a matching solution may include a PA pre-matched to intermediate impedance RLi at the output, which in turn is transformed into 50 Ohm by the BAW filter. The fact that the PA output match needs only to transform the RL load impedance to the RLi makes the implementation of the match desirable with a smaller component count and smaller occupied space requirement. Reduced output match complexity results in only 0.5 dB loss in the output PA matching network. Combined with the BAW filter loss of 1 dB, a total loss of 1.5 dB is achieved post PA. This is 1-1.5 dB improvement over standard matching plus filtering approach.

Figure 8:
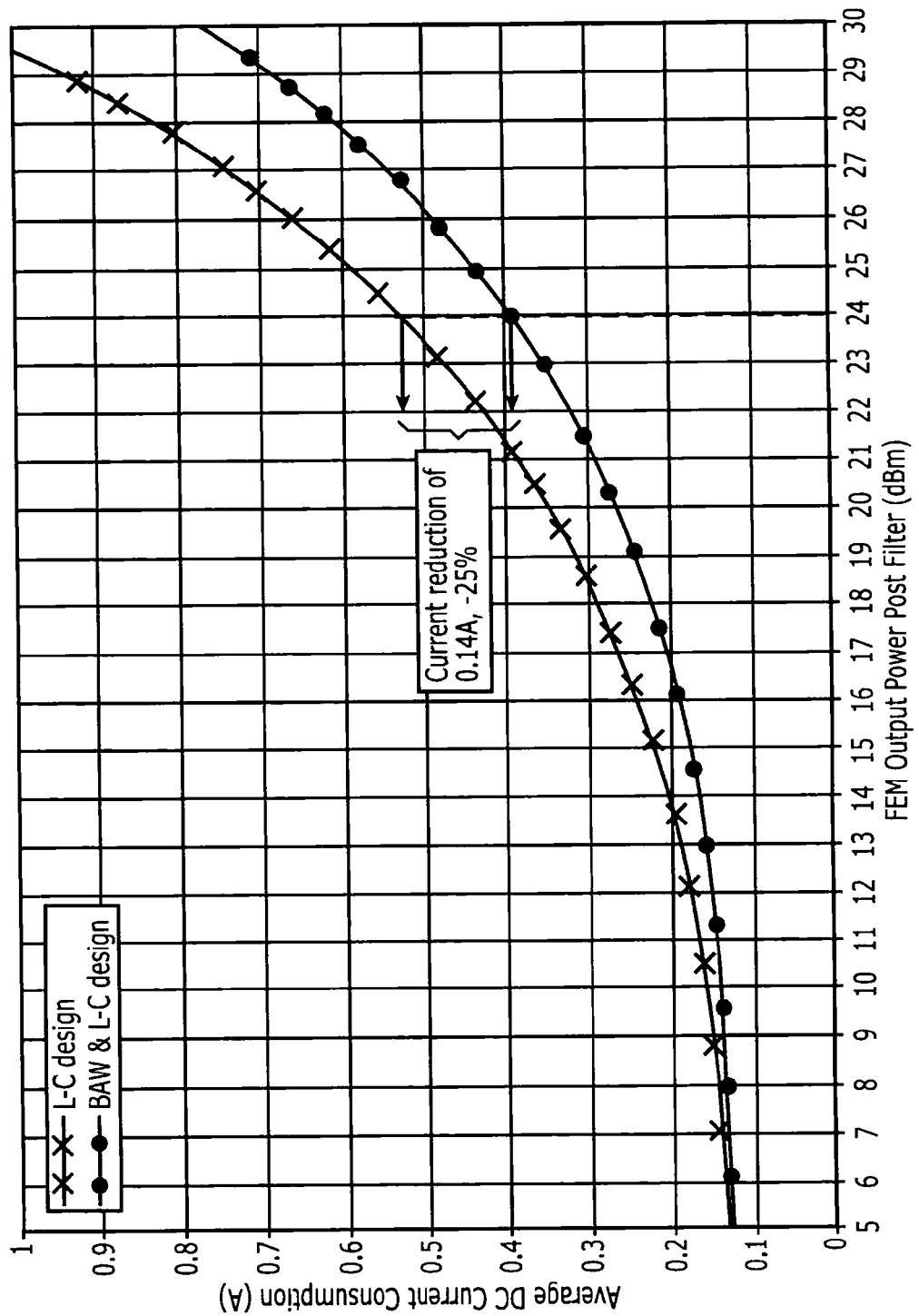
FIG. 8 illustrates a comparison of current consumption between a standard matching approach and matching using a BAW-L-C combination according to the teachings of the present invention.

Further, an example is drawn on an IEEE 802.16e WiMax PA design. RF output power required after the filter is 24 dBm. With the total post PA loss of 1.5 dB, the available power at the PA output must be 25.5 dBm. Considering for example a 20% efficient linear PA, a 1.77 W DC power will be dissipated to produce the required RF power. In contrast, as was shown in the case of the standard approach, 27 dBm of available power would be expected at the PA output. This would require 2.5 W DC dissipated power, which is 40% greater. As illustrated with reference to FIG. 8, a comparison between current consumption of a standard solution is made to the approach herein described based on the teachings of the present invention. As illustrated, DC current consumption is greatly reduced due to the lower available power requirement. It should be noted that the PA according to the teachings of the present invention may be designed with a greater power margin. Hence, the savings in the current consumption is 25%. It may be further improved, if needed. In addition, due to the lower required available power, the PA embodiment of the invention is reduced in complexity and size. Less dissipated power will also yield cooler overall system operation.

In cases where single-ended to balanced conversion is required in addition to a 1:10 impedance conversion, it is possible to use a dielectric layer and split up the center electrode of the structure. The same methods for single-ended to balanced conversion known from CRFs may then be applied. The method described above to achieve a feed-point with very low impedance is applicable.

As will come to the mind of those skilled in the art now having the benefit of the teachings of the present invention, embodiments of the invention may include a combination of the features of FIG. 2a and FIG. 2b to form a filter with a double feed-point on the input side that may be used for different power levels. The 5 Ohm feed-point, by way of example, may be used to transmit in a high-power mode while the 50 Ohm feed-point is used for a low-power mode.

Many modifications and other embodiments of the invention will come to the mind of one skilled in the art having the benefit of the teachings presented in the foregoing descriptions and associated drawings. Therefore, it is understood that the invention is not to be limited to the specific embodiments disclosed, and that modifications and embodiments are intended to be included within the scope of the appended claims.

That which is claimed is:
1. An RF system comprising:
a power amplifier having an output impedance;
a BAW filter having an input impedance and an output impedance, the BAW filter comprising top and bottom electrodes, first and second piezoelectric layers sandwiched between the top and bottom electrodes, and a center electrode sandwiched between the first and second piezoelectric layers so as to form a two resonator structure, wherein the center electrode is made of a metal stack of at least three layers of metal, and wherein the three layers of metal comprise copper doped aluminum sandwiched between tungsten layers; and a matching network including an inductance between the power amplifier and the BAW filter, wherein an impedance transformation ratio from the output impedance of the power amplifier to the output impedance of the BAW filter is at least 1:10.

2. The system according to claim 1, wherein at least one of the top and bottom electrodes comprises a stack of two metal layers.

3. The system according to claim 1, wherein the BAW filter further comprises a substrate and an acoustically reflective layer carried by the substrate, and wherein the bottom electrode is carried by the reflective layer.

4. The system according to claim 3, wherein the acoustically reflective layer comprises a plurality of reflective layers.

* * * * *